United States Patent
Houžvička et al.

(10) Patent No.: US 9,499,923 B2
(45) Date of Patent: Nov. 22, 2016

(54) METHOD FOR THE PREPARATION OF DOPED GARNET STRUCTURE SINGLE CRYSTALS WITH DIAMETERS OF UP TO 500 MM

(75) Inventors: Jindřich Houžvička, Turnov (CZ); Karel Bartoš, Turnov (CZ)

(73) Assignee: CRYTUR SPOL S.R.O., Turnov (CZ)

(*) Notice: Subject to any disclaimer, the term of this patent is extended or adjusted under 35 U.S.C. 154(b) by 671 days.

(21) Appl. No.: 13/979,751

(22) PCT Filed: Jan. 10, 2012

(86) PCT No.: PCT/CZ2012/000006
§ 371 (c)(1), (2), (4) Date: Jul. 15, 2013

(87) PCT Pub. No.: WO2012/110009
PCT Pub. Date: Aug. 23, 2012

(65) Prior Publication Data
US 2013/0291788 A1 Nov. 7, 2013

(30) Foreign Application Priority Data
Feb. 17, 2011 (CS) ........................... 2011-88

(51) Int. Cl.
*C30B 15/22* (2006.01)
*C30B 15/00* (2006.01)
*C30B 29/28* (2006.01)

(52) U.S. Cl.
CPC ............... *C30B 15/22* (2013.01); *C30B 15/00* (2013.01); *C30B 29/28* (2013.01)

(58) Field of Classification Search
CPC ....... C30B 15/00; C30B 15/14; C30B 15/20; C30B 15/206; C30B 15/22; C30B 15/26; C30B 15/28; C30B 29/00; C30B 29/10; C30B 29/22; C30B 29/28; C30B 33/00; C30B 33/02

USPC ......... 117/11, 13–15, 30, 35, 200–202, 206, 117/208, 217, 937, 944, 947
See application file for complete search history.

(56) References Cited

U.S. PATENT DOCUMENTS

| 4,534,821 A | 8/1985 | Sakaguchi et al. |
| 7,476,274 B2* | 1/2009 | Wehrhan ................. C30B 15/14 117/13 |

FOREIGN PATENT DOCUMENTS

| CN | 1191904 A | 9/1998 |
| CN | 101 705 516 A | 5/2010 |

(Continued)

OTHER PUBLICATIONS

International Search Report (PCT/ISA/210) issued on Apr. 4, 2012, by the Czech Republic Patent Office as the International Searching Authority for International Application No. PCT/CZ2012/000006.

(Continued)

*Primary Examiner* — Kenneth A Bratland, Jr.
(74) *Attorney, Agent, or Firm* — Buchanan Ingersoll & Rooney PC

(57) ABSTRACT

Preparation of lutetium and yttrium aluminate single crystals doped with rare earth oxides and transition elements consists in the preparation of oxide mixture sinter which is melted throughout and homogenized for a period of at least one hour. The crystal growth rate and broadening of the crystal cone are maintained uniform at an angle of at least 60° from the crystal axis up to a diameter of at least 80% of the crucible diameter which is at least 100 mm. The completion of the process occurs by separating the crystal from the melt while the crystal continues to be positioned inside the crucible in the zone wherein it was grown, and wherein final tempering of the crystal also takes place.

20 Claims, 2 Drawing Sheets

(56) References Cited

FOREIGN PATENT DOCUMENTS

| CZ | 248913 | 8/1984 |
|---|---|---|
| CZ | 300 631 B6 | 7/2009 |
| JP | 6-48889 A | 2/1994 |
| JP | 6-183877 A | 7/1994 |
| JP | 2008-74691 A | 4/2008 |
| JP | 2014508704 A | 4/2014 |

OTHER PUBLICATIONS

Informal Comments to the Written Opinion dated May 14, 2012, for International Application No. PCT/CZ2012/000006.

Yang, X.B., et al., Growth of large-sized Ce:Y3Al5O12 (Ce:YAG) scintillation crystal by the temperature gradient technique (TGT). Journal of Crystal Growth, 311(2009)3692 (7 pages).

Xu, C. H., et al., Temperature field design, process analysis and control of SAPMAC method for growth of large size sapphire crystals. Crystal Research Technology, 42, No. 8, 751-757 (2007) (7 pages).

Khattak, C.P. and F. Schmid, Growth of the world's largest sapphire crystals. Journal of Crystal Growth, 225(2001)572 (8 pages).

Hou, Engang "Growth and Properties Analysis for Czochralski method Mixing Nd3+: YAG Crystal," Chinese Master's Theses Full-text database, Engineering Science and Technology, vol. 2 2007, B014-125, pp. 9, 16-18.

First Chinese Office Action issued in CN application No. 201280008966.9 on Oct. 4, 2016, with English description (6 pages).

* cited by examiner

METHOD FOR THE PREPARATION OF DOPED GARNET STRUCTURE SINGLE CRYSTALS WITH DIAMETERS OF UP TO 500 MM

FIELD OF THE INVENTION

The present invention relates to the preparation of single crystal lutetium and yttrium aluminates with the general composition $(Lu,Y)_3Al_5O_{12}$ (garnet structure) doped with oxides of rare earths and some transition elements, with large diameters, whose utilisation is in the fields of scintillation detector, solid state laser, imaging or lighting technology (primarily LED) manufacture.

BACKGROUND OF THE INVENTION

The method conventionally used for the growing of crystals with the general structure $A_3B_5C_{12}$ (e.g. $Y_3Al_5O_{12}$ (YAG), $Lu_3Al_5O_{12}$ (LuAG) or $(Lu,Y)_3Al_5O_{12}$ (LuYAG)), with diameters of up to 80 mm and doped with various elements, is the Czochralski method. At the present time these crystals are intensively studied as prospective materials for very high efficiency solid state laser technologies, but have other uses such as in scintillators, optical elements, components for instrument or lighting engineering, and in jewelry making. Hence it is most desirable to prepare high-quality crystals with larger diameters. Such materials with diameters of 200 mm or even larger, and in optical quality have not yet been prepared. Growing of crystals by the Czochralski method ordinarily takes place in an iridium crucible. The melting point of the YAG crystal is 1950° C., the melting point of LuAG is 2050° C. and the melting point of iridium is 2 440° C., while the maximum critical temperature $T_{crit}$ for using an iridium crucible without causing any damage thereto is 2 300° C. The growing of large diameter YAG and LuAG crystals by the Czochralski method from iridium crucibles is very difficult due to the large radial temperature gradient (the difference in melt temperature at the crucible wall and in the middle thereof) which is essential for the preparation of optical-quality crystals. The growth zone of the crystal is separated from the tempering zone by a crucible lid. The crystal is pulled above the crucible lid; heat removal is resolved by pulling the crystal above the crucible lid where the tempering temperature is substantially lower than in the growth zone. Because of that, in order to grow large crystals it is necessary to modify the original Czochralski method or to prepare a different method.

An example of such modified technology for growing YAG, LuAG and GGG crystals with diameters above 80 mm by the Czochralski method is U.S. Pat. No. 7,476,274. It is possible to thus grow crystals only with very careful control of the phase interface and the maintenance thereof planar (not growing into the melt); and in order to remove the steep temperature gradient at the transition between the growth and tempering zones additional heating (an after-heater) is used. The process is controlled via optical process control and a constant growth during the process is maintained by regulation of the rotation speed. Such process complexity has negative effect on the yield of these crystals, and achieving the required large sizes still remains difficult.

Patent CZ 300 631 B6 describes the preparation of crystals for scintillation detectors and solid state lasers doped with rare earths.

Patent CZ 248913 describes the growing of single crystals from single and even multi-component oxide melts with maximum utilization of the melt contained within the crucible. This is achieved through temperature regime regulation and by defining the position of the maximum temperature isotherm in the crucible using the temperature gradient in the direction of the top rim of the crucible. The process is completed by the crystallizing of the material in the crucible. A particular disadvantage of this method is the fact that it is not possible to incorporate the same quantity of dopant within the crystal as is the concentration thereof in the melt; hence, the result is an inhomogeneous crystal. The aforementioned paper is not concerned with the issue of optical homogeneity of the crystal at the level currently required in view of the technical applications thereof.

Paper JP 6183877 A describes the growing of crystals by the Czochralski method wherein the temperature at the phase interface is controlled using an arrangement of thermocouples.

Apart from the aforementioned patent, large diameter yttrium and rare earth aluminate crystals were up until now prepared only using the HEM (Heat Exchange Method) and TGT (Temperature Gradient Technique) methods, both of which are very equipment-intensive.

The HEM method (Khattak, C. P. and F. Schmid, Growth of the world's largest sapphire crystals. Journal of Crystal Growth, 225(2001)572) uses a large-diameter molybdenum crucible which is placed within the apparatus in a support that is in contact with a relatively small-diameter heat exchanger end. An oriented seed crystal is placed at the bottom of the crucible at the point of contact with the heat exchanger and the crucible is loaded with melt charge. The apparatus is closed and evacuated and the temperature of the charge is gradually increased. Before melting down the charge, helium gas is forced through the heat exchanger and washes over the crucible bottom in the position where the seed crystal is located, so that the seed crystal does not melt down completely but there is only partial meltdown thereof. Crystal growth is initiated and maintained by further temperature reduction in the heat exchanger. Crystallisation starts on the partially melted seed crystal at the bottom of the crucible. During the growth stage cooler material stays near the bottom of the crucible and hotter material is in the upper part thereof, which stabilizes the temperature gradient and minimises convection in the melt. During growth the growing crystal remains submerged under the surface of the melt at all times and is thus protected against mechanical and temperature perturbations by the surrounding melt. This stabilises the melt-crystal phase interface which, in this case, is curved and hence it is not necessary to equilibrate these asymmetries by rotating the crucible or crystal. Complete solidification of the charge is achieved by controlled reduction of the furnace heat exchanger temperature. The last portion of the material to crystallise is located at the crucible wall. The HEM method has the primary disadvantage of high costs in a process using expensive helium.

The difference between the HEM and TGT methods is that TGT does not use helium (nor any other gas) as the heat transfer medium and the temperature gradient is created by suitable heating element geometry and by using water-cooled graphite electrodes. The seed crystal is inserted into a narrowed cylindrical or conical feature in the crucible bottom, which in turn is placed onto a water-cooled metal (molybdenum) support. Similar crucible design is also used in the Bridgman-Stockbarger method. For the reasons stated hereinabove, using conical-shaped crucibles is preferable for growing crystals. The TGT method was patented in 1985. However, garnet structure crystals (for now YAG) still do not exhibit sufficient quality parameters utilizable in the manufacture of demanding optical elements (Yang, X. B., et al., Growth of large-sized Ce:Y$_3$Al$_5$O$_{12}$ (Ce:YAG) scintillation crystal by the temperature gradient technique (TGT). Journal of Crystal Growth, 311(2009)3692). The TGT method is also described in Chinese patent 101705516 A.

Large size aluminates are also grown by the Bagdasarov method (also called Horizontal Directed Crystallisation). Crystals are grown from the melt in a boat-shaped crucible which is pulled in the horizontal direction across a temperature gradient. The grown material is melted by passing the crucible through a heating zone wherein the crystalline phase is created in a suitably selected temperature gradient. In order to obtain a crystal with an exact orientation, a seed with the desired orientation is placed in the narrow part of the boat. These crystals have a rectangular (not round) shape and their optical properties are generally regarded as being inadequate.

Several other methods are used to grow large diameter crystals. Worth mentioning are primarily the following: EFG, Stepanov, Stockbarger, Bridgman, etc. However, these methods are not used to grow the aforementioned large-sized crystals, whether in terms of quality or even the ability to achieve garnet structure crystals with diameters over 100 mm.

Neither is the Kyropoulos method of preparation used to grow large YAG crystals. This method is primarily employed to grow large sapphire and titanium-doped sapphire single crystals. Out of other materials, the following are grown using this method: CsI, CaF$_2$, CsB$_3$O$_5$, LiF, KYb(WO$_4$)$_2$, NaCl, KCl, KBr and some large diameter semiconductor crystals such as InP, GaAs, and ZnTe.

The method was first used in 1926 for the preparation of single crystals (Z. Anorg. Chem. 154(1926)308). This method of single crystal preparation can be implemented with resistance heating as well as with induction heating of the crucible, with arbitrary growth atmosphere compositions (including vacuum) and arbitrary crucible materials. The principle of the Kyropoulos method partly proceeds from the Czochralski method of single crystal preparation (Z. Physik. Chem. 92(1917)219). The apparatus for the Kyropoulos method is similar to that for the Czochralski method. If we compare single crystal preparation techniques by the Czochralski and Kyropoulos methods, it is evident that the Czochralski method is suitable for the preparation of longer, smaller-diameter crystals, and, on the contrary, in the Kyropoulos method the growing crystal is not pulled out of the melt via the seed crystal (Czochralski), but growth is controlled by the removal of heat through the seed crystal and by reducing the melt temperature such that the growth isotherm, corresponding to the melting point of the grown crystal, proceeds into the melt and crystal growth occurs under the surface of the melt. Upon melting the charge, the homogenisation thereof and upon setting the growth temperature, an oriented seed crystal of the required material with a square or circular cross-section and rotating at a low speed (2-5 rpm) is submerged into the melt to the geometric centre of the crucible. For the Czochralski method, it is characteristic that the crystal diameter is at most 0.6 times the crucible diameter.

Another method for growing large crystals is the SAPMAC (Sapphire Growth Technique with Micro-Pulling and Shoulder Expending at Cooled Centre) method (Cryst. Res. Technol. 8(2007)751. The SAPMAC method is based on pulling a sapphire crystal out of the melt contained in a molybdenum crucible by introducing a cooled seed crystal, widening the profile to the required size, and a combination of slow pulling of the crystal and the slow ingrowing thereof into the melt.

For growing crystals in an oxidizing atmosphere (nitrogen+oxygen mixture), growing takes place in a furnace with induction heating in an iridium crucible. In the case of using a reducing atmosphere (argon+hydrogen mixture), growing takes place in a resistance furnace in a molybdenum or tungsten crucible. The decisive factor for using either type of growing atmosphere when growing doped YAG or LuAG crystals is, apart from other things, the required oxidation state of the dopant. In the case of growing YAG crystals: Yb$^{3+}$, LuAG:Yb$^{3+}$ it is necessary to use an oxidizing atmosphere (nitrogen+oxygen mixture) in order to prevent the reduction of Yb$^{3+}$→Yb$^{2+}$, and growing must take place in an Ir crucible. On the other hand, in the case of YAG:Ce crystals where the presence of Ce$^{3+}$ is desirable, a molybdenum or a tungsten crucible and a reducing atmosphere are preferred.

Large garnet structure crystals (YAG, LuAG, GGG doped with oxides of cerium, praseodymium, neodymium, ytterbium, samarium, holmium, dysprosium, erbium, terbium and thulium, but also of vanadium, manganese and titanium) are finding utilization in a number of applications whereof the primary ones include scintillation and imaging (e.g. medical, safety, non-destructive testing, instrumentation), lighting (wafers or conventional lighting elements in combination with LED), jewelry making or laser (high-efficiency solid state lasers).

As is apparent from the foregoing overview, at present there is no satisfactory method for the preparation of these materials in the requisite optical quality, price and size.

DESCRIPTION AND EMBODIMENTS OF THE INVENTION

The present method relates to the preparation of garnet structure crystals doped with certain transition metal and rare earth elements, with the composition Y$_3$Al$_5$O$_{12}$, Lu$_3$Al$_5$O$_{12}$, Y$_{(3-x)}$(RE,TM)$_x$Al$_5$O$_{12}$ or Lu$_{(3-x)}$(RE,TM)$_x$Al$_5$O$_{12}$), wherein (RE) are the rare earth elements Ce, Pr, Nd, Sm, Eu, Tb, Dy, Ho, Er, Tm, Yb, (TM) are the transition elements V, Cr, Ti, Mn, Co, and x is 0 to 3. The aforementioned shortcomings in respect of the preparation thereof in a crucible placed within a furnace, wherein a rotating single crystal seed is put in contact with the melt while the axial temperature gradient within the volume of the melt containing crucible ranges from 0.1 to 10° C./cm, and preferably within the range of 1 to 6° C./cm, and wherein crystal growth onto the seed crystal occurs at the contact area of the single crystal seed with the melt, are addressed by the present new method of preparation of these materials, which, in accordance with the present invention, consists in a multi-component mixture of an oxide system being homogenised and pressed into blocks, which are pre-sintered up to the ceramic transition temperature whereat shrinkage and incorporation of dopants within the oxide lattice occurs; the said blocks are then placed into a crucible and melted throughout. The melt is stirred and homogenised by melt flow due to a differential axial temperature gradient or by mechanical stirring of the metal oxides while micro-bubbles are concurrently removed from the melt, for a period of at least 1 hour. Thereafter, a single crystal seed with the minimum dimensions of 8×8 mm and length of 100 mm is contacted with the surface of the homogenised melt contained within the crucible and placed within a growing furnace. For fast heat removal, the single crystal seed is secured in a ceramic, metal or single crystal, respectively water-cooled holder, and rotates at a speed of 1 up to 20 revolutions per minute, and is pulled at a speed of 0.1 to 2 mm/hr. Towards the end of the process the rotation and pulling speeds are reduced towards zero. The crystal growth rate and crystal pulling speed arc regulated by temperature adjustment at the crystal/melt interface on the basis of optical, weight or visual monitoring of the crystal. The broadening of the crystal cone is maintained uniform at an angle of at least 60° from the crystal axis up to a diameter of at least 80% of the crucible diameter, the minimum diameter whereof is 100 mm. Upon reaching the desired crystal diameter, the diameter thereof is maintained by temperature regulation at the crystal/melt interface with minium deviations from the achieved diameter while concurrently the crystal grows in under the melt. The temperature at the crystal/melt interface is regulated on the basis of optical, weight or visual monitoring of the crystal, typically by regulating the furnace power, but also by other methods such as the pulling and rotating speeds. The completion of the process takes place by separating the crystal from the melt while, however, the crystal always remains in the zone wherein it was grown, the growth zone is identical with the tempering zone, the final tempering of the crystal is carried out in the tempering zone just below the melting temperature of the crystal for at least 2 hours, and the rate of temperature reduction is at most 100° C./hr.

Preferred embodiment the oxide mixture is melted through at temperature greater than the melting temperature and stirred for at least 2 hours prior to the placement of the single crystal seed into the crucible, in order to increase homogeneity thereof and to remove micro-bubbles.

If crystal growing proceeds in a tungsten or molybdenum crucible with resistance heating and predominantly molybdenum or tungsten reflectors, the growing atmosphere is vacuum or is a reducing atmosphere, preferably nitrogen or argon with an addition of hydrogen with partial pressure of at least 1 kPa. For better heat removal, the use of greater hydrogen content is desirable.

If growing proceeds in an iridium crucible with induction heating, the growing atmosphere consists of nitrogen or argon and contains at least 0.1 vol. % of oxygen.

A single crystal with a composition according to the general formula $(Lu,Y)_{(3-x)}(RE,TM)_xAl_5O_{12}$, wherein (RE, TM) includes the elements Ce, Pr, Nd, Sm, Dy, Ho, V, Cr, Ti, Mn, Co and wherein x=0.002 to 0.05, is grown from the corresponding melt in vacuum or in a reducing atmosphere, e.g. in the gaseous mixture $Ar+H_2$.

A single crystal with a composition according to the general formula $(Lu,Y)_{(3-x)}(RE,TM)_xAl_5O_{12}$, wherein (RE, TM) includes the elements Eu, Tb, Er, Yb and wherein x=0.002-1.5, is grown from the corresponding melt in vacuum or in a reducing atmosphere of a gaseous mixture $Ar+H_2$.

A single crystal with the composition $(Lu,Y)_{(3-x)}(RE,TM)_xAl_5O_{12}$, wherein (RE, TM) includes the elements Ce, Pr, Nd, Sm, Dy, Ho, V, Cr, Ti, Mn, Co and wherein x=0.002 to 0.05, is grown from the corresponding melt in an oxidizing atmosphere of a gaseous mixture of nitrogen or argon with at least 0.1 vol. % of oxygen.

A single crystal with the composition $(Lu,Y)_{(3-x)}(RE,TM)_xAl_5O_{12}$, wherein (RE, TM) includes the elements Eu, Tb, Er, Yb and wherein x=0.002 to 1.5, is grown from the corresponding melt in an oxidizing atmosphere of a gaseous mixture of nitrogen or argon with at least 0.1 vol. % of oxygen.

According to the present invention, crystals are prepared by controlled crystallisation of the aforesaid oxide melts without pulling the crystal out of the tempering zone. With this method it is essential to maintain the axial and radial temperature gradients in the melt within precisely specified intervals depending on the weight, diameter and length of the growing crystal. This is achieved by suitable geometry of the heating and screening system, heating elements and by using computer-controlled power input to the heating system.

The setup for the growing of crystals is assembled in accordance with FIG. 1. FIG. 1 shows a crystal 7 in the growth stage under the surface of the melt. In the present method, growth is initiated by contacting the seed crystal 1 with the melt 2. On making contact the seed is in close connection with the melt surface such that it is submerged thereunder by at most ca 0.1 mm, and such that the bottom face of the seed crystal is engaged with the melt. The seed crystal removes a large portion of the heat of crystallisation. The diameter thereof must be at least φ8 mm or an 8×8 mm section, and length at least 100 mm, and must be attached onto a metal holder 3. The metal holder may also be water-cooled. The seed crystal is positioned from above the melt. In the case of resistance heating (heating elements 4), the desired axial gradient in the tempering zone is created by an arrangement of molybdenum or tungsten cylinders 5 and asymmetrically horizontally positioned tungsten and molybdenum metal plates—reflectors 6 of various thickness with rectangular-shaped apertures. The spacing of individual horizontal reflectors 6 is selected such that the axial temperature gradient in the tempering zone ranges between 1 to 6° C./cm, wherewith steady growth of the crystal 7 is secured. The desired axial gradient in the melt is created using shaped heating elements 4 and cone-shaped reflectors 8 that secure the heating of the crucible 9, in order to prevent solidification of the growing crystal onto the crucible wall or the bottom thereof. Overall, the crystal grows in the so-called tempering zone 10 which is delimited by the inner part of the crucible and by the space from the crucible up to the first layer of reflectors 8. The tempering zone may consist from several sub-zones with independent temperature control regulation.

In the case of resistance heating, the desired radial gradient is created by concentric molybdenum and tungsten cylinders of various diameters and heights such that the temperature gradient in the melt is within the range to 5° C./cm.

In the case of induction heating, the seed crystal 1 is again positioned on a holder 3 from the top. Axial and radial gradients are created by an arrangement of concentrically placed ceramic cylinders 11 and asymmetrically separated discs 12 with circular apertures separated by ceramic pellets or zirconia felt 13 such that the axial and radial temperature gradients in the tempering zone are in the range to 5° C./cm. The growing of the crystal 7 takes place in an iridium crucible 9; again, the crystal grows into the melt 2. The tempering zone 10, which the crystal does not leave during the entire period of growth and tempering thereof, is delimited by the crucible 9, the first ceramic cylinder 11 and the nearest upper disc 12. An example of a suitable arrangement is shown in FIG. 2.

One of the characteristics of the present invention is that the method is utilized at a temperature over 1500° C. for a multi-component system. Therewith the present method significantly differs from the methods used e.g. for growing sapphire, e.g. the SAPMAC method, wherein the system is single component only. A multi-component system causes a number of problems already during the very growing of crystals. When various phases or local differences in concentration are present, crystal cracking occurs. Fundamental problems then occur upon putting these crystals into application, wherein even minute differences between individual components mean that the crystal is not optically homogeneous, does not scintillate or is not usable as a laser. A further key characteristic of the present invention is the perfect homogenisation of the oxide mixture which takes place via thorough through-melting and flow of the melt within the crucible prior to the initiation of the growing process. The actual melt flow actually induced by a temperature gradient along the entire length and diameter of the crucible is carried out with such an arrangement of reflectors and shielding (FIG. 1 or FIG. 2), that a precise temperature gradient between the bottom and top part of the crucible, and the outer wall and the inside thereof, is created. For better homogenization, upon the melting thereof the raw material can be further stirred mechanically using a molybdenum, tungsten or iridium wire, depending on the growing atmosphere used. Another characteristic hereof consists in the conditions for preparing the raw material prior to the placement thereof into the furnace. The raw material is pressed into blocks and pre-sintered up to a temperature whereat further shrinkage and partial through-reacting in the solid phase occurs. Preferably all or some of the oxides are homogeneously mixed even prior to pressing.

Crystal growth may be divided into two stages: i) broadening of the crystal to the desired diameter; and ii) growth of the cylindrical part thereof. Growth in the first stage is computer-controlled depending on the crucible diameter such that uniform broadening of the diameter from the seed crystal diameter to the required diameter occurs. The process is regulated by monitoring weight gain in a given time interval via computer-controlled variation (decreasing, increasing) of temperature (input power), respectively by varying the pulling or rotational speed of the crystal. During this stage the seed crystal rotating about its axis at a speed of 1 to 20 rpm is very slowly pulled out of the melt at a speed for 0.1 to 2 mm/hour. In view of the rotation thereof the crystal is of a circular cross-section, i.e. the broadening of the crystal is cone-shaped. The angle between the hypotenuse of the cross-section of the crystal and the centre axis thereof ranges between 60° to 88°. The diameter of the crystal is primarily determined by the crucible diameter; the crystal cylinder diameter ranges from 80% to 98% of the crucible diameter. As soon as broadening of the crystal to the required diameter occurs, the growth is further controlled such that no decrease in diameter and no jamming on the crucible wall occur. The easiest method consists in temperature (input power) regulation. The monitoring of gain and diameter is carried out via weighing the growing crystals using an optical system or visually by the operator. Crystal growth is completed by the crystallisation of the entire crucible contents, or prior thereto by separation of the crystal from the remaining melt.

Another characteristic of the present method is that the crystal is not removed from the crucible space or very closely there above (the tempering area) and continues to be tempered in order to eliminate internal stresses. This fact makes the present method substantially different form e.g. the Czochralski method. Within the space of the tempering zone the temperature gradient is maintained in the range of 1 to 10° C./cm which constitutes a fundamental precondition for the growing of large crystals without the occurrence of a large difference in thermal expansion between opposite sides of the crystal. Separation of the crystal from the melt is preferably used in multi-component systems with different partition coefficients.

The growing atmosphere is vacuum wherein the removal of gases dissolved in the melt takes place and bubble entrapment in the growing crystal is suppressed, an oxidizing atmosphere (in case of requirement for a higher oxidation state in the dopant, e.g. with ytterbium), or a reducing atmosphere containing hydrogen. Preferably an atmosphere containing hydrogen with partial pressure of at least 1 kPa is used in view of the high thermal conductivity thereof. Thanks to its high thermal conductivity hydrogen removes the heat of crystallisation and thereby substantially increases the thermal stability and controllability of the process, which is subsequently reflected in the improved optical parameters of the crystal.

Another characteristic of the present method is that there is in-growing of the crystal under the surface of the melt—as opposed to e.g. U.S. Pat. No. 7,476,274. The crystal size is typically larger than 80 mm with the upper limit defined by the crucible diameter. The size of the crystal at the diameter thereof can hence reach up to 500 mm, which is a multiple figure when compared with up-until-now known methods of preparation of garnet structure crystals.

A lower temperature gradient in the melt during crystal growth in comparison with e.g. the Czochralski method leads to greater homogeneity of the temperature distribution within the melt. Concurrently, there is a reduction in the temperature gradient in the growing crystal and hence also a reduction of stress inside the grown crystal induced by the temperature distribution gradient within the crystal. The optical properties of the material are very good and the crystal also contains to a much lesser extent, or even does not contain at all, the central core typical in crystals grown by the Czochralski method onto a cone-shaped phase interface.

Upon completion of the crystallization process, the temperature during tempering is reduced gradually. For YAG crystals the temperature is preferably maintained just below the melting temperature for a longer period of time (at least 1 hour) in order to achieve relaxation of the crystal lattice. Preferably a short-time increase in temperature can also be used such that possible melt-off of the crystal from the crucible wall or from residual melt occurs. Only then is the crystal temperature slowly decreased, at fastest at the rate of 100° C./hr.

Compared to the currently used methods for the growing of garnet structure crystals, there are fundamental differences. In comparison with the HEM method, no helium cooling is used. Nonetheless, hydrogen containing atmospheres may be preferably used. A fundamental difference compared to the HEM and TGT methods in use is the furnace setup, where these methods—as opposed to the present—method employ a seed crystal located under the melt (crystallization from the bottom up) and not the pulling thereof from the melt (crystallization from top to bottom). This allows for better homogenization of the melt and leads to better optical properties in the crystal. Compared to the Bagdasarov method, the present method employs crystallization flowing from the melt which yields better homogeneity in the grown crystal.

OUTLINES OF FIGURES

EXAMPLES

Example 1

Figure 1:
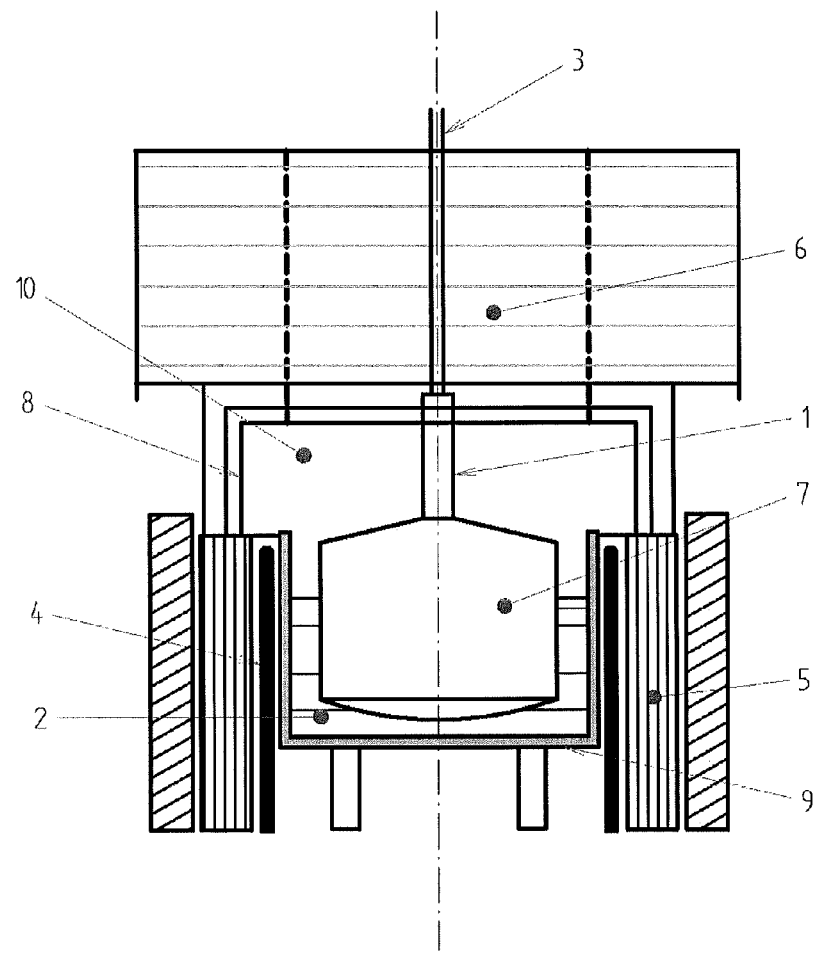
FIG. 1 shows a crystal 7 in the growth stage under the surface of the melt with resistance heating.

Growing of the $Lu_{3-x}Pr_xAG$ crystal wherein x=0.002-0.05, in a protective atmosphere of Ar+10 to 40 vol. % of hydrogen in accordance the setup in FIG. 1 (x=molar percent of Pr in the crystal). Growing takes place in a W crucible with the volume of 3 $dm^3$ in a resistance heated furnace heated by tungsten elements 4. The raw material (LuAG, $Lu_2O_3$ and $Al_2O_3$ sinter) and "praseodymium colorant" ($Pr_6O_{11}$ in the mixture 20 wt % $Pr_6O_{11}$ and 80 wt % $Al_2O_3$) is weighed into the crucible 9 in the stoichiometric ratio 29.93 wt % $Al_2O_3$+(65.07-69.87) wt % $Lu_2O_3$+(0.2-5) wt % $Pr_6O_{11}$. The raw materials are placed in the tungsten crucible 9 which is placed into the tempering zone 10 consisting of W or Mo cylinders 5 and horizontal 6 and cone-shaped reflectors 8, such that the axial temperature gradient within the space containing the crucible and melt is 1° C./cm. The raw material is melted and homogenized by forced flow of the melt initiated by the difference in temperature between the bottom and top parts of the crucible. A <111> oriented seed crystal 1 secured in a holder 3 made of a high thermal conductivity metal (molybdenum) is contacted with the oxide melt surface 2. It is then pulled at the speed of 0.2 mm/hr. The crystal cone is broadened at an angle of 80° from the crystal axis up to the value of 94% of the crucible inner diameter and then the said diameter is maintained constant by the regulation of the furnace input power in connection with optical monitoring of the crystal diameter. Upon achieving the desired weight, the pulling and rotation are halted and the crystal is crystallized into the melt. The crystal then undergoes computer-controlled tempering for 2 hours at a temperature just below the melting point and computer-controlled cooling to room temperature with reduction of 80° C./hr. The result is a LuAG:Pr single crystal of pale green colour with a flat phase interface and weight of 10 kg.

Example 2

Figure 2:
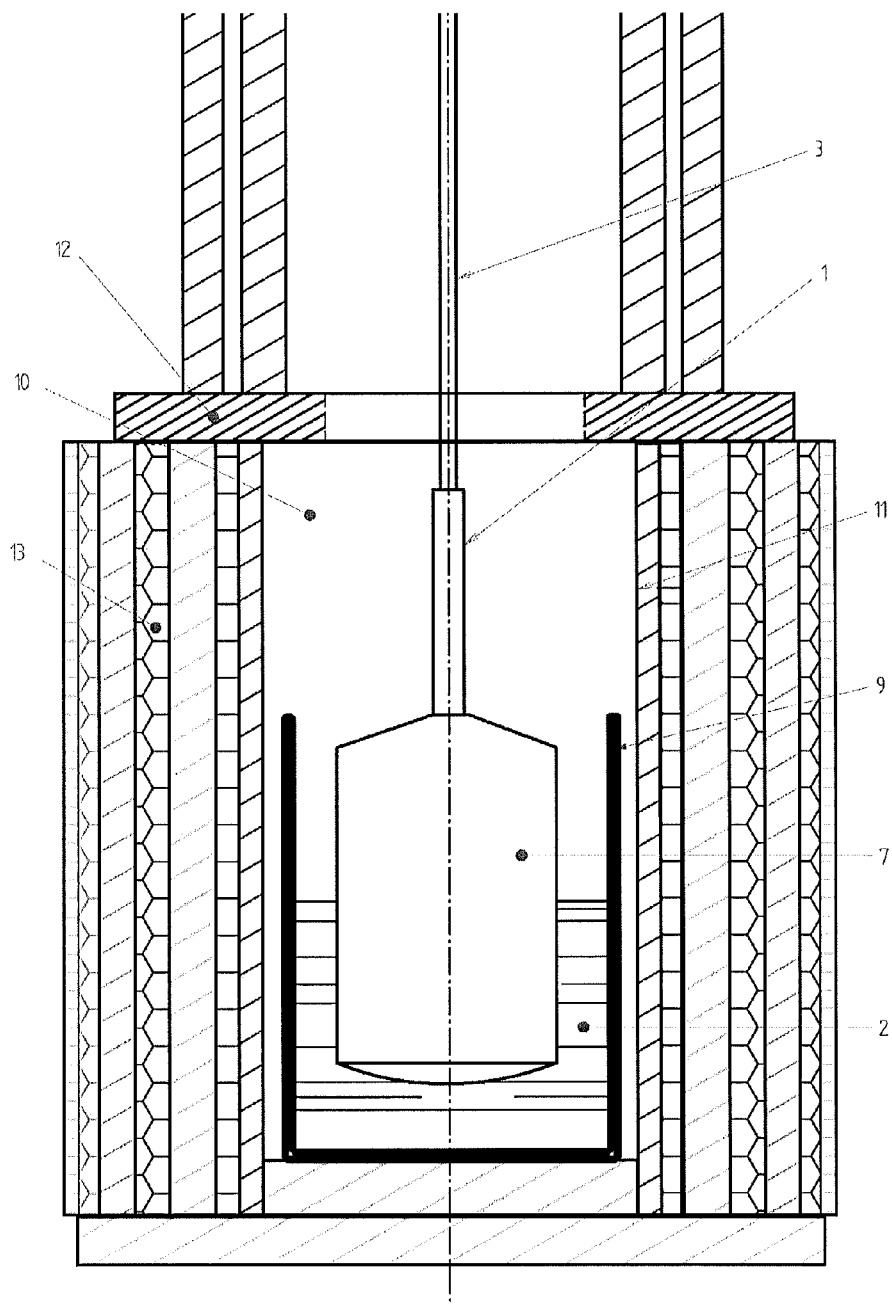
FIG. 2 shows a crystal 7 in the growth stage under the surface of the melt with induction heating.

Growing of the $Lu_{3-x}Yb_xAG$ crystal wherein x=0.002-0.5, in a protective atmosphere of nitrogen +0.1 vol. % of oxygen in accordance with the setup in FIG. 2 (x=molar percent of ytterbium in the crystal). Growing takes place in an iridium crucible 9 with the volume of 1 $dm^3$ in an induction heated furnace. The sinter (isostatically pressed raw materials LuAG, $Lu_2O_3$, $Lu_2O_3$ annealed at 1500° C.) and so-called "ytterbium colorant" (a mixture of 50 wt % $Yb_2O_3$ and 50 wt % $Al_2O_3$ annealed at 1500° C.) are weighed into the crucible in the stoichiometric ratio of 29.93 wt % $Al_2O_3$+(20.07-69.87) wt % $Lu_2O_3$+(0.2-50) wt % $Yb_2O_3$. The raw materials are placed in the iridium crucible 9 which is placed into the tempering zone 10 consisting of ceramic cylinders 11, insulating felt or pellets 13 and horizontal discs 12, such that the axial temperature gradient within the space containing the crucible and melt is 2° C./cm. The raw material is melted. An <110> oriented seed crystal 1 secured in a holder 3 made of a high thermal conductivity material (sapphire) is contacted with the oxide melt surface 2. It is then pulled at the speed of 0.1-0.5 mm/hr. The rotation speed is 2 rpm. The crystal cone is broadened at an angle of 70° from the crystal axis up to the value of 90% of the crucible inner diameter and then the diameter is maintained constant by weighing the weight gain of crystal. Upon achieving the desired mass (depending on the crucible volume wherefrom the crystal is grown), the crystal is lifted via a fast skip by 3 mm and subjected to computer-controlled cooling to room temperature. The result is a colourless LuAG:Yb single crystal with a flat phase interface and weight of 1 to 5 kg.

Example 3

Growing of the $Lu_{3-x}Yb_xAG$ crystal wherein x=0.002-0.5 in, a protective atmosphere of nitrogen+0.1 vol. % of oxygen in accordance with the setup in FIG. 2 (x=molar percent of Yb in the crystal). Growing takes place in 2 $dm^3$ iridium crucibles in an induction heated furnace. The pulling speed is 0.1--0.5 mm/hr. The rotation speed is 4 rpm. The raw material (YAG, $Al_2O_3$, and $Y_2O_3$) and "ytterbium colorant" (a mixture of 50 wt % $Yb_2O_3$ and 50 wt % $Al_2O_3$) are weighed into the crucible in the stoichiometric ratio of 42.45 wt % $Al_2O_3$+(0.2-50) wt % $Lu_2O_3$+(7.55-57.55) wt % $Yb_2O_3$. The raw material is melted and the crystal pulled on a <111> oriented seed crystal at a speed of 0.1-0.5 mm/hr. Upon achieving the desired weight (depending on the crucible volume wherefrom the crystal is grown), the crystal is lifted via a fast skip by 3 mm and subjected to computer-controlled cooling to room temperature. The result is a colourless YAG:Yb single crystal with a flat phase interface and weight of 2 to 7 kg.

Example 4

Growing of the $Lu_{3-x}Ce_xAG$ crystal wherein x=0.002-0.05, in a protective atmosphere of Ar+10 to 40 vol. % of hydrogen in accordance with the setup in FIG. 1 (x=molar percent of Ce in the crystal). Growing takes place in a 2 $dm^3$ Mo crucible in an induction heated furnace heated by tungsten elements. The pulling speed is 0.1-0.5 mm/hr. The rotation speed is 2 rpm. The raw material (LuAG, $Lu_2O_3$, and $Al_2O_3$ sinter), and "cerium oxide colorant" (a mixture of 20 wt % $CeO_2$ and +80 wt % $Al_2O_3$) is weighed into the crucible in the stoichiometric ratio of 29.93 wt % $Al_2O_3$+ (65.07-69.87) wt % $Lu_2O_3$+(0.2-5) wt % $CeO_2$. The raw material is melted and the crystal pulled on a <111> or <110> oriented seed crystal at a speed of 0.1-0.5 mm/hr. Upon achieving the desired weight (depending on the crucible volume wherefrom the crystal is grown), the crystal is lifted via a fast skip by 10 mm and subjected to computer-controlled cooling to room temperature. The result is a yellow-coloured LuAG:Ce single crystal with a flat phase interface and weight of 8 kg.

Example 5

Growing of the $Y_{3-x}Ce_xAG$ crystal wherein x=0.002-0.05, in a protective atmosphere of Ar+10 to 40 vol. % of hydrogen in accordance with the setup in FIG. 1 (x=molar percent of Ce in the crystal). Growing takes place in a 10 $dm^3$ W crucible in a resistance heated furnace heated by tungsten elements. The pulling speed is 0.1 mm/hr. The rotation speed is 1 rpm. The raw material (LuAG, $Al_2O_3$, and $Y_2O_3$ sinter), and "cerium oxide colorant" ($CeO_2$ in a mixture of 20 wt % $CeO_2$ and +80 wt % $Al_2O_3$) is weighed into the crucible in the stoichiometric ratio of 42.45 wt % $Al_2O_3$+(52.55-57.35) wt % $Lu_2O_3$+(0.2-5) wt % $CeO_2$. The raw material is melted and the crystal pulled on a <111> oriented seed crystal at a speed of 0.1-0.5 mm/hr. Upon achieving the desired weight, the crystal is lifted via a fast skip by 15 mm and subjected to computer-controlled cooling to room temperature. The result is a yellow-coloured YAG: Ce single crystal with a flat phase interface, diameter of 200 mm and weight of 28 kg.

Example 6

Growing of the YAG ($Y_3Al_5O_{12}$) crystal in a protective atmosphere of Ar+40 vol. % hydrogen in accordance with the setup in FIG. 1. Growing takes place in a 0.15-3 $dm^3$ Mo or W crucible in a resistance heated furnace heated furnace with carbon heating elements. The pulling speed is 0.1-0.5 mm/hr. The rotation speed is 2 rpm. The raw material, YAG sinter, is weighed into the crucible and upon the melting thereof is pulled on a <111> or <110> oriented seed crystal at a speed of 0.1-0.5 min/hr. Upon achieving the desired weight, the crystal is lifted via a fast skip by 3 mm and subjected to computer-controlled cooling to room temperature. The result is a colourless crystal with a flat phase interface and weight of 2 to 8 kg.

Example 7

Growing of the LuAG ($Lu_3Al_5O_{12}$) crystal in a protective atmosphere of nitrogen +0.1 vol. % oxygen in accordance with the setup in FIG. 2. Growing takes place in 0.75-2 $dm^3$ iridium crucibles in an induction heated furnace. The pulling speed is 0.1-0.5 mm/hr. The rotation speed is 2 rpm. The raw material (LuAG sinter) is weighed into the crucible, melted and the crystal is pulled on a <111> or <110> oriented seed crystal at a speed of 0.1-0.5 mm/hr. Upon achieving the desired weight (depending on the crucible volume wherefrom the crystal is grown), the crystal is lifted via a fast skip by 3 mm and subjected to computer-controlled cooling to room temperature. The result is a colourless LuAG single crystal with a flat phase interface and weight of 2.5 to 10 kg.

INDUSTRIAL APPLICABILITY

The present invention can be employed for the manufacture of lutetium and yttrium aluminate single crystals, undoped or doped with oxides of rare earths and some transition elements, with diameters greater than 80 mm, whose utilization is in the field of manufacture of scintillation and imaging (e.g. medicinal, safety, non-destructive testing, instrumentation), lighting (wafers or conventional lighting elements in combination with LED), jewelry making or laser (high-efficiency solid state lasers) technologies.

The invention claimed is:

1. A method for the preparation of single crystals with large diameters of up to 500 mm, with a garnet structure (aluminates of lutetium and yttrium) optionally doped with one or more transition elements and oxides of rare earth elements, with the general composition of $Y_3Al_5O_{12}$, $LU_3Al_5O_{12}$, $Y_{(3-x)}(RE,TM)_xAl_5O_{12}$ or $Lu_{(3-x)}(RE,TM)_xAl_5O_{12}$), wherein (RE) are the rare earth elements Ce, Pr, Nd, Sm, Eu, Tb, Dy, Ho, Er, Tm, Yb, (TM) are the transition elements V, Cr, Ti, Mn, Co, and x is 0 to 3; the method comprising:

rotating a single crystal seed in a crucible placed in a furnace wherein the rotating single crystal seed is contacted with a melt while an axial temperature gradient within a space containing the crucible with the melt ranges from 0.1 to 10° C./cm; and growing a single crystal at a place of contact between the single crystal seed and the melt such that crystal growth onto the single crystal seed occurs to form the single crystal;

wherein powdered metal oxides are pressed into blocks and pre-sintered up to the ceramic transition temperature whereat further shrinkage and partial through-reaction in a solid phase thereof occurs, wherein the blocks are used to prepare the melt, and the melt is stirred and homogenized by melt flow or mechanical stirring of the metal oxides with concurrent removal of micro-bubbles from the melt so as to form a homogenized melt, for a period of at least 1 hour;

wherein the single crystal seed has a diameter of at least 8 mm or minimum dimensions of 8×8 mm, and a length of at least 100 mm, and is secured in a holder, the single crystal seed put in contact with a surface of the homogenized melt at a location contained within the crucible placed inside the furnace;

wherein at the location of contact of the single crystal seed with the melt, crystal growth onto the single crystal seed occurs under a surface of the melt while during the process, the single crystal seed is rotated at a speed of 1 to 20 rpm and pulled at the speed of 0.1 to 2 mm/hr, while the crystal growing rate and broadening of a crystal cone on the single crystal seed are maintained uniform at an angle of at least 60° from a crystal axis of the single crystal seed up to a diameter of at least 80% of a diameter of the crucible having a minimum diameter of at least 100 mm;

wherein uniform growth and broadening of the crystal cone are maintained uniformly at the angle of at least 60° from the crystal axis by adjusting the crystal pulling speed, and by temperature regulation at the crystal/melt interface on the basis of optical, weight or visual monitoring;

wherein upon reaching the desired diameter of the crystal cone, the diameter thereof is further maintained with minimum deviation from the achieved diameter by temperature regulation at the crystal/melt interface, and regulation of the crystal pulling and rotation speed, on the basis of optical, weight or visual monitoring;

wherein towards the completion of the process the rotation and pulling speed are reduced to zero, the completion of the process takes place by separating the single crystal from the melt while, the single crystal is maintained inside the crucible in a zone wherein it was grown;

wherein the growth zone is identical with a tempering zone, and final tempering of the single crystal is carried out in the tempering zone just below the melting point of the single crystal for at least 2 hours, and the rate of temperature reduction of the single crystal is at the most 100° C./hr.

2. The method according to claim 1, wherein the powdered metal oxides are mixed and homogenized prior to stirring.

3. The method according to claim 1, wherein the crystal growing takes place in a tungsten or molybdenum crucible with resistance heating and reflectors predominantly made of molybdenum or tungsten.

4. The method according to claim 3, wherein the growing atmosphere is a vacuum atmosphere.

5. The method according to claim 3, wherein the growing atmosphere is a reducing atmosphere.

6. The method according to claim 3, wherein the growing atmosphere is argon with an addition of hydrogen with a partial pressure of at least 1 kPa.

7. The method according to claim 1, wherein the growing proceeds in an iridium crucible with induction heating, wherein the growing atmosphere consists of nitrogen or argon and contains at least 0.1 vol. % of oxygen.

8. The method according to claim 1, wherein the melt prepared from the blocks of the powdered metal oxides is stirred for at least 2 hours at a temperature greater than the melting point thereof in order to increase the homogeneity thereof and to remove internal stress thereof.

9. The method according to claim 1, wherein a single crystal with the composition $(Lu,Y)_{(3-x)}(RE,TM)_x Al_5 O_{12}$, wherein (RE, TM) includes the elements Ce, Pr, Nd, Sm, Dy, Ho, V, Cr, Ti, Mn, Co and wherein x=0.002 to 0.05, is grown from the corresponding melt in a vacuum atmosphere or a reducing atmosphere of a gaseous mixture of $Ar+H_2$.

10. The method according to claim 1, wherein a single crystal with the composition $(Lu,Y)_{(3-x)}(RE,TM)_x Al_5 O_{12}$, wherein (RE, TM) includes the elements Eu, Tb, Er, Yb and where x=0.002-1.5, is grown from the corresponding melt in a vacuum atmosphere or a reducing atmosphere of a gaseous mixture of $Ar+H_2$.

11. The method according to claim 1, wherein a single crystal with the composition $(Lu,Y)_{(3-x)}(RE,TM)_x Al_5 O_{12}$, wherein (RE, TM) includes the elements Ce, Pr, Nd, Sm, Dy, Ho, V, Cr, Ti, Mn, Co and wherein x=0.002 to 0.05, is grown from the corresponding melt in a vacuum atmosphere or an oxidizing atmosphere in a gaseous mixture of nitrogen or argon gas with at least 0.1 vol. % of oxygen.

12. The method according to claim 1, wherein a single crystal with the composition $(Lu,Y)_{(3-x)}(RE,TM)_x Al_5 O_{12}$, wherein (RE, TM) includes the elements Eu, Tb, Er, Yb and wherein x=0.002 to 1.5, is grown from the corresponding melt in an oxidizing atmosphere of a gaseous mixture of nitrogen or argon with at least 0.1 vol. % of oxygen.

13. The method according to claim 2, wherein the growing proceeds in an iridium crucible with induction heating, wherein the growing atmosphere consists of nitrogen or argon and contains at least 0.1 vol. % of oxygen.

14. The method according to claim 2, wherein a single crystal with the composition $(Lu,Y)_{(3-x)}(RE,TM)_x Al_5 O_{12}$, wherein (RE, TM) includes the elements Ce, Pr, Nd, Sm, Dy, Ho, V, Cr, Ti, Mn, Co and wherein x=0.002 to 0.05, is grown from the corresponding melt in a vacuum atmosphere or a reducing atmosphere of a gaseous mixture of $Ar+H_2$.

15. The method according to claim 3, wherein a single crystal with the composition $(Lu,Y)_{(3-x)}(RE,TM)_x Al_5 O_{12}$, wherein (RE, TM) includes the elements Ce, Pr, Nd, Sm, Dy, Ho, V, Cr, Ti, Mn, Co and wherein x=0.002 to 0.05, is grown from the corresponding melt in a vacuum atmosphere or a reducing atmosphere of a gaseous mixture of $Ar+H_2$.

16. The method according to claim 2, wherein a single crystal with the composition $(Lu,Y)_{(3-x)}(RE,TM)_x Al_5 O_{12}$, wherein (RE, TM) includes the elements Eu, Tb, Er, Yb and where x=0.002-1.5, is grown from the corresponding melt in a vacuum atmosphere or a reducing atmosphere of a gaseous mixture of $Ar+H_2$.

17. The method according to claim 3, wherein a single crystal with the composition $(Lu,Y)_{(3-x)}(RE,TM)_x Al_5 O_{12}$, wherein (RE, TM) includes the elements Eu, Tb, Er, Yb and where x=0.002-1.5, is grown from the corresponding melt in a vacuum atmosphere or a reducing atmosphere of a gaseous mixture of $Ar+H_2$.

18. The method according to claim 2, wherein a single crystal with the composition $(Lu,Y)_{(3-x)}(RE,TM)_x Al_5 O_{12}$, wherein (RE, TM) includes the elements Ce, Pr, Nd, Sm, Dy, Ho, V, Cr, Ti, Mn, Co and wherein x=0.002 to 0.05, is grown from the corresponding melt in a vacuum atmosphere or an oxidizing atmosphere in a gaseous mixture of nitrogen or argon gas with at least 0.1 vol. % of oxygen.

19. The method according to claim 3, wherein a single crystal with the composition $(Lu,Y)_{(3-x)}(RE,TM)_x Al_5 O_{12}$, wherein (RE, TM) includes the elements Ce, Pr, Nd, Sm, Dy, Ho, V, Cr, Ti, Mn, Co and wherein x=0.002 to 0.05, is grown from the corresponding melt in a vacuum atmosphere or an oxidizing atmosphere in a gaseous mixture of nitrogen or argon gas with at least 0.1 vol. % of oxygen.

20. The method according to claim 1, wherein the axial temperature gradient within the space containing the crucible with the melt ranges from 1 to 6° C./cm.

\* \* \* \* \*